United States Patent
Tanabe

(10) Patent No.: US 10,415,899 B2
(45) Date of Patent: Sep. 17, 2019

(54) COOLING SYSTEM, SUBSTRATE PROCESSING SYSTEM AND FLOW RATE ADJUSTING METHOD FOR COOLING MEDIUM

(71) Applicant: ASM IP Holding B.V., Almere (NL)

(72) Inventor: Nobuaki Tanabe, Kawasaki (JP)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 15/856,629

(22) Filed: Dec. 28, 2017

(65) Prior Publication Data

US 2019/0204029 A1    Jul. 4, 2019

(51) Int. Cl.
| | |
|---|---|
| F28F 13/06 | (2006.01) |
| F28F 27/00 | (2006.01) |
| H01J 37/32 | (2006.01) |
| C23C 16/46 | (2006.01) |
| H01L 21/67 | (2006.01) |
| G01F 1/32 | (2006.01) |
| G01F 1/684 | (2006.01) |
| F28D 9/00 | (2006.01) |

(52) U.S. Cl.
CPC ............ *F28F 13/06* (2013.01); *C23C 16/463* (2013.01); *F28D 9/0081* (2013.01); *F28F 27/00* (2013.01); *G01F 1/3209* (2013.01); *G01F 1/6842* (2013.01); *H01J 37/32724* (2013.01); *H01L 21/67248* (2013.01)

(58) Field of Classification Search
None
See application file for complete search history.

(56) References Cited

U.S. PATENT DOCUMENTS

| | | | | |
|---|---|---|---|---|
| 7,221,553 | B2* | 5/2007 | Nguyen | H01L 21/67109 361/233 |
| 7,726,874 | B2* | 6/2010 | Kirchberg | F28F 27/00 374/147 |
| 2006/0219360 | A1* | 10/2006 | Iwasaki | G05D 23/1902 156/345.27 |
| 2007/0091537 | A1* | 4/2007 | Buchberger, Jr. | ........................... H01L 21/67069 361/234 |
| 2007/0251456 | A1* | 11/2007 | Herchen | H01L 21/67109 118/724 |

(Continued)

OTHER PUBLICATIONS

Water Cooling Calculator—Ness Engineering Inc.—WEBSITE (Year: 2017).*

(Continued)

*Primary Examiner* — Binu Thomas
(74) *Attorney, Agent, or Firm* — Studebaker & Brackett PC

(57) ABSTRACT

Examples of a cooling system include a flow channel through which a cooling medium flows, a valve that is provided in the flow channel and configured to adjusts a flow rate of the cooling medium, a thermometer for measuring temperature of the cooling medium, a flowmeter for measuring a flow rate of the cooling medium passing through the valve, and a controller for determining cooling capacity of the cooling medium from measurement results of the thermometer and the flowmeter, and adjusting the valve so that the cooling capacity of the cooling medium approaches to a target value when the determined cooling capacity is different from the target value.

11 Claims, 4 Drawing Sheets

(56) References Cited

U.S. PATENT DOCUMENTS

2015/0134128 A1* 5/2015 Mahadeswaraswamy ............ H01J 37/32522
700/282
2017/0051406 A1 2/2017 Mori et al.

OTHER PUBLICATIONS

Wikipedia-Cooling capacity (Year: 2019).*
NESLAB System II Liquid to Liquid Heat Exchanger from Thermo Electron Corporation (Year: 2003).*
Chiller Cooling Capacity—How to calculate—The Engineering Mindset (Year: 2017).*

* cited by examiner

COOLING SYSTEM, SUBSTRATE PROCESSING SYSTEM AND FLOW RATE ADJUSTING METHOD FOR COOLING MEDIUM

TECHNICAL FIELD

Examples are described which relate to a cooling system, a substrate processing system and a flow rate adjusting method for cooling medium.

BACKGROUND

There is a substrate processing system having a cooling system for cooling a substrate. In the substrate processing system, processing such as film formation, etching or film reformation, etc. is executed on a substrate. The substrate can be cooled by bringing the substrate into contact with a cooled portion which is cooled by a cooling medium. There are cases where it is required to accurately control the degree of cooling to be executed on a cooling target such as a substrate or the like.

The temperature of a cooling medium varies due to factors such as the difference between day and night, seasonal difference, regional difference, or difference in Fab, etc. However, it is rare to perform strict temperature management on the cooling medium. Furthermore, introduction of a chiller for the temperature management of the cooling medium remarkably increases the cost of the system.

It has been required to provide a cooling system capable of performing accurate cooling at a low cost.

SUMMARY

Some examples described herein may address the above-described problems. Some examples described herein may provide a cooling system, a substrate processing system and a flow rate adjusting method for a cooling medium that can provide a cooling system capable of performing accurate cooling at a low cost.

In some examples, a cooling system may include a flow channel through which a cooling medium flows, a valve that is provided in the flow channel and configured to adjusts a flow rate of the cooling medium, a thermometer for measuring temperature of the cooling medium, a flowmeter for measuring a flow rate of the cooling medium passing through the valve, and a controller for determining cooling capacity of the cooling medium from measurement results of the thermometer and the flowmeter, and adjusting the valve so that the cooling capacity of the cooling medium approaches to a target value when the determined cooling capacity is different from the target value.

DETAILED DESCRIPTION

A cooling system, a substrate processing system and a flow rate adjusting method for a cooling medium will be described with reference to the drawings. The same or corresponding constituent elements are represented by the same reference signs, and the duplicative descriptions thereof may be omitted.

Figure 1:
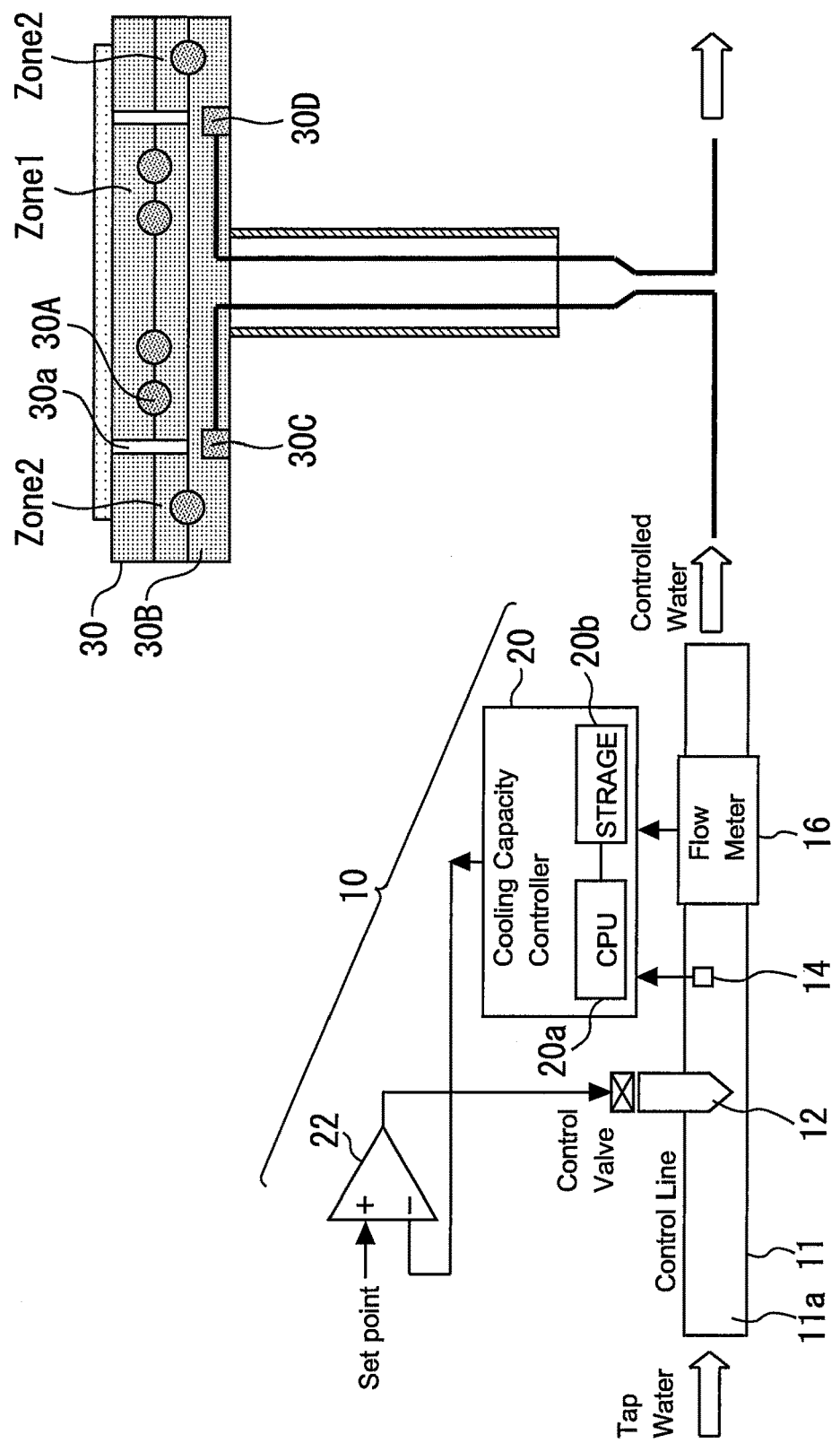
FIG. 1 is a diagram showing the substrate processing system.

FIG. 1 is a diagram showing the substrate processing system. The substrate processing system has a cooling system 10. The cooling system 10 has a flow channel 11 through which a cooling medium 11a flows. The cooling medium 11a is water or an antifreeze solution, for example. The flow channel 11 is provided with a valve 12. The flow rate of the cooling medium 11a can be adjusted by adjusting the opening degree of the valve 12. The valve 12 may functions as a flow rate control valve.

The flow channel 11 is provided with a thermometer 14 for measuring the temperature of the cooling medium 11a. A thermocouple, a resistance thermometer bulb or a well-known temperature sensor may be used as the thermometer 14. A flowmeter 16 is provided to measure the flow rate of the cooling medium 11a passing through the valve 12. A well-known flowmeter such as a Karman vortex flowmeter may be used as the flowmeter 16.

The cooling system 10 has a controller 20. The controller 20 acquires measurement results of the thermometer 14 and the flowmeter 16. The controller 20 determines the cooling capacity of the cooling medium 11a from these measurement results.

Figure 2:
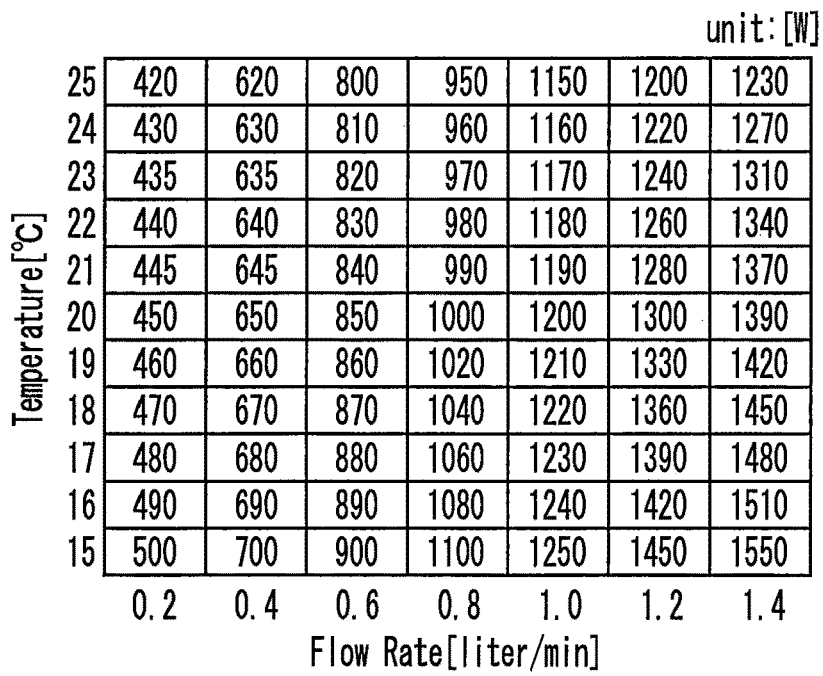
FIG. 2 shows an example of the table.

In order to determine the cooling capacity, the controller 20 may has a processor 20a and a storage device 20b. A table with which the cooling capacity of the cooling medium can be derived from the values of the temperature and the flow rate may be stored in the storage device 20b. FIG. 2 shows an example of the table as described above. The ordinate axis of the table of FIG. 2 represents the temperature of the cooling medium, and the abscissa axis of the table represents the flow rate of the cooling medium. It is supposed that the temperature of the cooling medium ranges from 15 to 25° C., and it is also supposed that the flow rate of the cooling medium ranges from 0.2 to 1.4 liters/minute. Other values may be used in other examples.

In the processor 20a, the cooling capacity of the cooling medium 11a is determined by using this table. The unit of the cooling capacity of the cooling medium 11a is wattage, for example. When the temperature of the cooling medium 11a measured by the thermometer 14 is equal to 20° C. and the flow rate of the cooling medium 11a measured by the flowmeter 16 is equal to 0.8 liters/minute, the cooling capacity of the cooling medium 11a can be determined as 1000 W by effectively using the table of FIG. 2.

Figure 3:
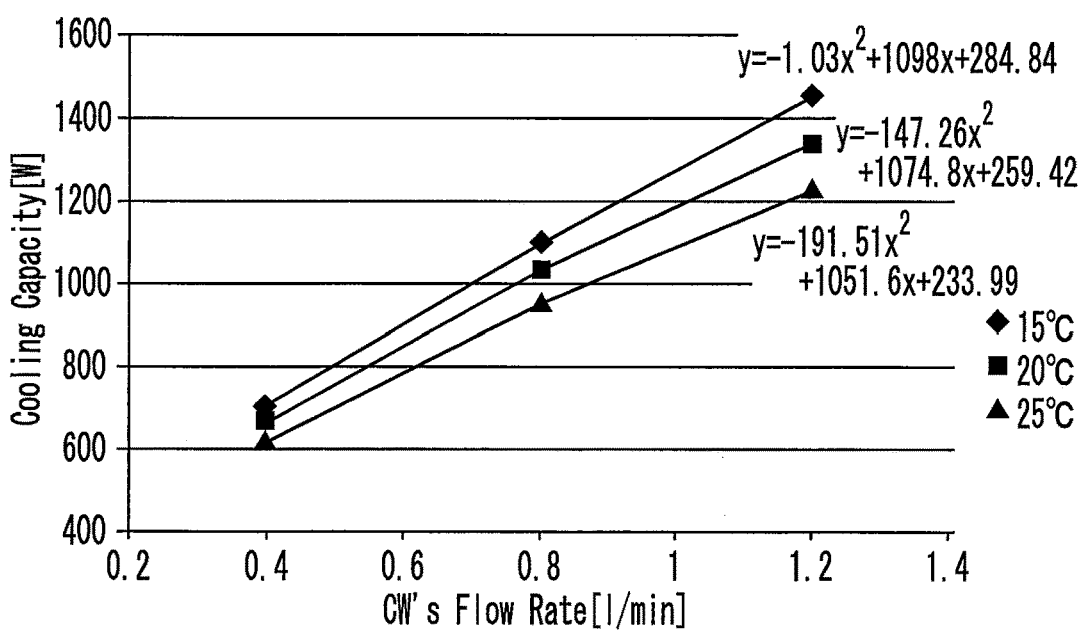
FIG. 3 shows an example of the function to be stored in the storage device.

The cooling capacity can be determined by a method other than the method of using the table. For example, a function with which the cooling capacity of the cooling medium can be derived from the values of the temperature and flow rate of the cooling medium may be stored in the storage device of the controller so that the cooling capacity of the cooling medium can be determined by using the function in the processor. FIG. 3 shows an example of the function to be stored in the storage device. FIG. 3 shows functions at the temperatures of 15° C., 20° C. and 25° C. of the cooling medium, respectively. The abscissa axis of FIG. 3 represents the flow rate of cooling water serving as the cooling medium, and the ordinate axis represents the cooling capacity. In this case, it is supposed that the temperature of the cooling medium ranges from 15 to 25° C. For example, the cooling capacities obtained when the flow rate of cooling water at a fixed temperature is changed are plotted with several points, whereby a relational expression between the flow rate of the cooling water and the cooling capacity may be experimentally determined.

The function corresponding to the temperature nearest to the temperature of the thermometer 14 is selected from the three functions shown in FIG. 3, and the flow rate measured by the flowmeter is substituted into the selected function to acquire the cooling capacity. Four or more functions may be stored in the storage device. As the number of the functions increases, more accurate cooling capacity can be acquired.

When the determined cooling capacity is different from a target value, the controller 20 may adjusts the valve 12 so that the cooling capacity of the cooling medium 11a approaches to the target value. In the example of FIG. 1, a comparator 22 for comparing the cooling capacity determined by the controller 20 with the target value is shown. The comparator 22 decreases the opening degree of the valve 12 when the cooling capacity is larger than the target value, and increases the opening degree of the valve when the cooling capacity is smaller than the target value. The comparator 22 as described above may be contained in the controller 20.

The cooling medium 11a whose cooling capacity is controlled by the above-mentioned method is used to cool a susceptor 30, for example. The susceptor 30 is shown in FIG. 1. The susceptor 30 is provided with a first heater 30A and a second heater 30B. The number and arrangement of heaters provided in the susceptor 30 are arbitrary. A groove 30a is formed between the first heater 30A and the second heater 30B. The cooling medium 11a flows through cooling flow channels 30C and 30D to cool the susceptor 30. The cooling flow channels 30C and 30D form one annular flow channel in plan view. The cooling medium 11a flows between the first heater 30A and the second heater 30B in plan view. In the example of FIG. 1, the cooling medium cools a lower portion of the groove 30a. The center portion of the susceptor 30 is heated by the first heater 30A which is an inner heater, and the outer portion of the susceptor 30 is heated by the second heater 30B which is an outer heater. The flow of the cooling medium 11a between the first heater 30A and the second heater 30B may enhances thermal independence between the center portion and the outer portion of the susceptor 30.

In a case where the susceptor 30 is provided with a cooling portion and a heater to control the temperature distribution of the susceptor 30, an intended temperature distribution could not be realized even by enhancing the precision of heating control based on the heater if the cooling capacity of the cooling portion is unstable. The unstable cooling capacity is derived from, for example, a cooling medium such as general cooling water or the like for which temperature management is loose.

By using the above-mentioned cooling system 10, the susceptor 30 may be cooled by the cooling medium 11a whose cooling capacity is accurately controlled. Therefore, the temperature distribution of the susceptor 30 can be controlled to an intended temperature distribution without any expensive and large-size device such as a chiller or the like. Furthermore, when a multi-zone heater for realizing the temperature which is different according to the position of the susceptor 30 is adopted, the temperature gradient from the center of the susceptor in the circumferential direction may be controlled by using the cooling medium whose cooling capacity is accurately controlled. In the susceptor 30, the center portion heated by the first heater 30A and the outer portion heated by the second heater 30B are provided concentrically with each other. Plural zones which are different in temperature may be provided in a different arrangement from the foregoing arrangement.

Figure 4:
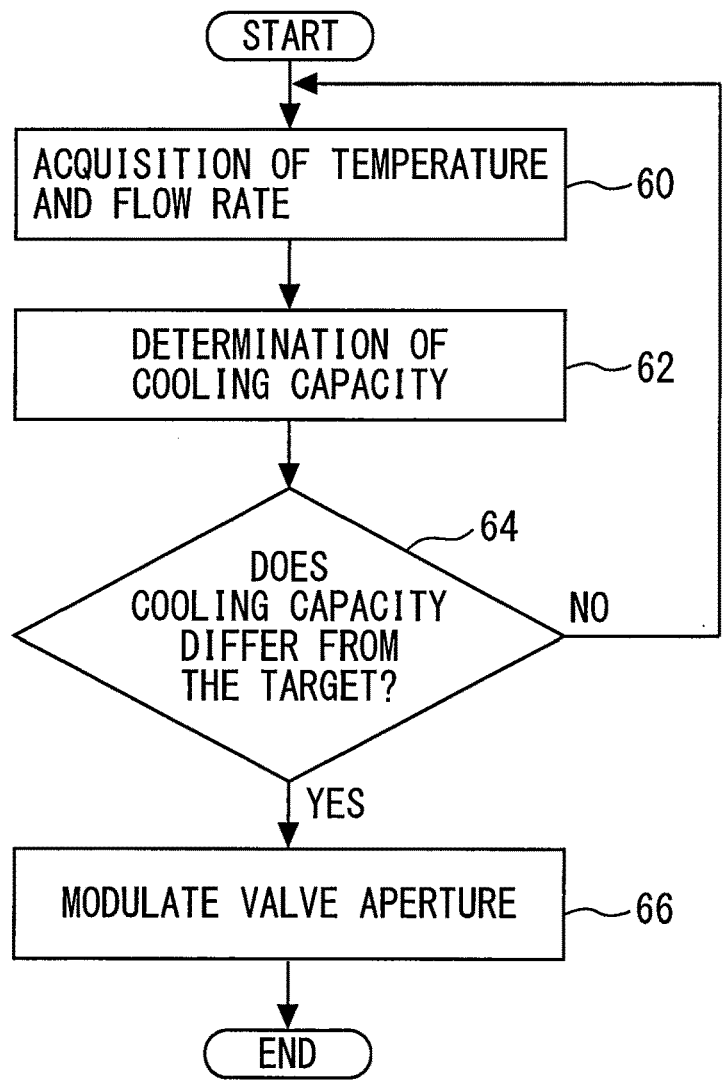
FIG. 4 is a flowchart of the operation of the cooling system.

FIG. 4 is a flowchart of the operation of the above-mentioned cooling system 10. First, information on the temperature of the cooling medium 11a and the flow rate of the cooling medium 11a is acquired in step 60. Subsequently, the processing goes to step 62. In step 62, the cooling capacity of the cooling medium 11a is acquired from the information on the temperature and the flow rate obtained in step 60. For example, the cooling capacity of the cooling medium may be derived by using the above-mentioned table or function that enables derivation of the cooling capacity of the cooling medium. The cooling capacity may be rapidly determined by using the above-mentioned table or function.

Subsequently, the processing goes to step 64. In step 64, the cooling capacity determined in step 62 is compared with a target value of the cooling capacity. The target value is acquired from the outside or a recipe. When it is determined in step 64 that the cooling capacity is coincident with the target value of the cooling capacity, it is unnecessary to adjust the valve 12. In this case, the processing returns to step 60 to resume the processing. On the other hand, when the cooling capacity is different from the target value, the flow rate of the cooling medium 11a is adjusted so that the cooling capacity of the cooling medium 11a approaches to the target value. For example, in step 66, the opening degree of the valve 12 may be adjusted.

By performing the flow shown in FIG. 4 periodically or at a proper timing, the cooling capacity of the cooling medium 11a may be accurately controlled. For example, the temperature of the cooling medium 11a may vary due to factors such as the difference between day and night, seasonal difference, regional difference, or difference in Fab, etc. However, a constant cooling capacity can be maintained at all times by setting the cooling capacity having a unit of wattage itself as a control target. The target value of the cooling capacity may be continually used as a fixed value, or the target value may be temporally changed. For example, a target value may be described in a recipe, and the target value defined in the recipe may be used for a lot to be processed based on the recipe. In this case, a proper target value can be used for each lot.

Figure 5:
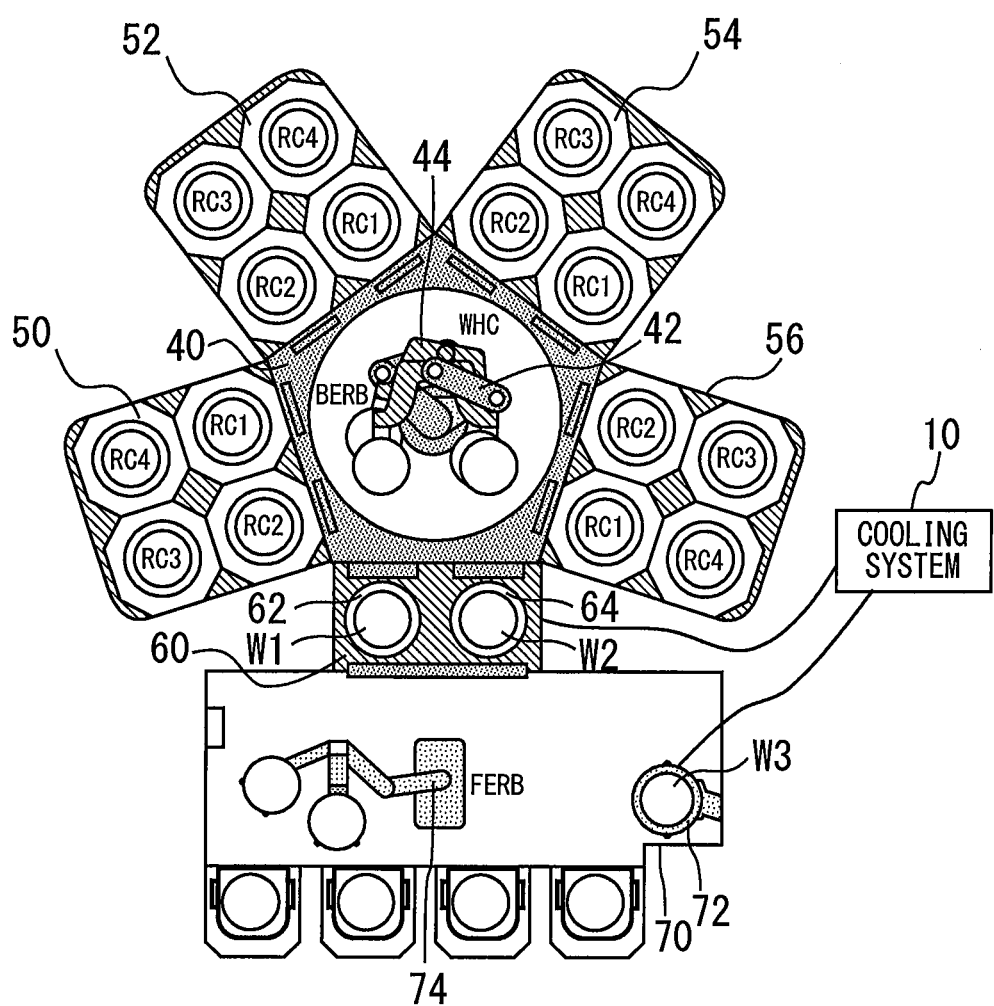
FIG. 5 is a diagram showing a substrate processing system according to another example, all arranged in accordance with examples described herein.

Various cooled portions of the substrate processing system can be cooled by using the cooling medium whose flow rate is adjusted in the above-mentioned cooling system 10. The cooled portion is, for example, the susceptor 30, but a different portion may be set as a cooled portion. FIG. 5 is a diagram showing a substrate processing system according to another example. This substrate processing system has reactor chambers 50, 52, 54, 56 for processing a substrate. A wafer handling chamber 40 is connected to the reactor chambers 50, 52, 54 and 56. The wafer handling chamber 40 is provided with robots 42 and 44 for transporting wafers. A load lock device 60 is connected to the wafer handling chamber 40. The load lock device 60 has stages 62, 64. Wafers W1, W2 may be mounted on the stages 62, 64.

An EFEM (Equipment Front End Module) 70 is connected to the load lock device 60. A cooling stage 72 may be provided in the EFEM 70. The cooling stage 72 is a stage for cooling the substrate such as Wafer W3. A robot 74 for transporting a substrate is provided in the EFEM 70. The above-mentioned cooling system 10 is connected to the load lock device 60 and the cooling stage 72. That is, the cooled portions in the configuration of FIG. 5 are the load lock device 60 and the cooling stage 72.

The cooling of the substrate in the load lock device 60 and the cooling stage 72 can be stabilized by providing the load lock device 60 and the cooling stage 72 with the cooling medium whose cooling capacity is controlled in the cooling system 10. The cooling system 10 may be connected to only one of the load lock device 60 and the cooling stage 72.

According to the examples described herein, the flow rate of the cooling medium is adjusted to maintain the cooling capacity of the cooling medium, so that a cooling system capable of performing accurate cooling can be provided at a low cost.

What is claimed is:

1. A cooling system comprising:
a flow channel through which a cooling medium flows;
a valve that is provided in the flow channel and configured to adjusts a flow rate of the cooling medium;
a thermometer for measuring temperature of the cooling medium;
a flowmeter for measuring a flow rate of the cooling medium passing through the valve; and
a controller that includes a processor and a storage device, the storage device storing a table or a function, such that the cooling capacity of the cooling medium is configured to be derived, using the table or the function, from values of the temperature and the flow rate, wherein
the processor determines cooling capacity of the cooling medium by comparing measurement results of the thermometer and the flowmeter to the table or the function stored by the storage device, and adjusts the valve so that the cooling capacity of the cooling medium approaches to a target value when the determined cooling capacity is different from the target value.

2. The cooling system according to claim 1, wherein the storage device stores the table, and the processor determines the cooling capacity of the cooling medium by using the table.

3. The cooling system according to claim 1, wherein the storage device stores the function, and the processor determines the cooling capacity of the cooling medium by using the function.

4. The cooling system according to claim 1, further comprising a comparator for comparing the cooling capacity determined by the controller with the target value, and decreasing an opening degree of the valve when the cooling capacity is larger than the target value and increasing the opening degree of the valve when the cooling capacity is smaller than the target value.

5. A substrate processing system comprising:
a cooling system including a flow channel through which a cooling medium flows, a valve that is provided in the flow channel and configured to adjusts a flow rate of the cooling medium, a thermometer for measuring temperature of the cooling medium, a flowmeter for measuring a flow rate of the cooling medium passing through the valve, and a controller including a processor and a storage device, the storage device storing a table or a function, such that the cooling capacity of the cooling medium is configured to be derived, using the table or the function, from values of the temperature and the flow rate, wherein the processor determines cooling capacity of the cooling medium by comparing measurement results of the thermometer and the flowmeter to the table or the function stored by the storage device, and adjusts the valve so that the cooling capacity of the cooling medium approaches to a target value when the determined cooling capacity is different from the target value; and
a cooled portion to be cooled with the cooling medium that is adjusted in the flow rate by the cooling system.

6. The substrate processing system according to claim 5, wherein the cooled portion is a susceptor.

7. The substrate processing system according to claim 6, further comprising a heater provided in the susceptor.

8. The substrate processing system according to claim 7, wherein the heater has a first heater and a second heater, and the cooling medium flows between the first heater and the second heater in plan view.

9. The substrate processing system according to claim 8, wherein the susceptor has a groove between the first heater and the second heater, and the cooling medium cools a lower portion of the groove.

10. The substrate processing system according to claim 5, further comprising:
a reactor chamber for processing a substrate;
a wafer handling chamber connected to the reactor chamber;
a load lock device connected to the wafer handling chamber; and
an EFEM (Equipment Front End Module) connected to the load lock device, wherein the cooled portion is the load lock device.

11. The substrate processing system according to claim 5, further comprising:
an EFEM (Equipment Front End Module); and
a cooling stage provided in the EFEM, wherein the cooled portion is the cooling stage.

* * * * *